(12) United States Patent
Liu et al.

(10) Patent No.: US 9,147,638 B2
(45) Date of Patent: Sep. 29, 2015

(54) INTERCONNECT STRUCTURES FOR EMBEDDED BRIDGE

(71) Applicant: INTEL CORPORATION, Santa Clara, CA (US)

(72) Inventors: Yueli Liu, Chandler, AZ (US); Chong Zhang, Chandler, AZ (US); Qinglei Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/951,122

(22) Filed: Jul. 25, 2013

(65) Prior Publication Data

US 2015/0028486 A1  Jan. 29, 2015

(51) Int. Cl.
  *H01L 23/52* (2006.01)
  *H01L 23/48* (2006.01)
  *H01L 21/50* (2006.01)
  *H01L 23/00* (2006.01)

(52) U.S. Cl.
  CPC ................ *H01L 23/48* (2013.01); *H01L 21/50* (2013.01); *H01L 24/13* (2013.01); *H01L 24/16* (2013.01); *H01L 2224/13101* (2013.01); *H01L 2224/16225* (2013.01); *H01L 2924/15192* (2013.01)

(58) Field of Classification Search
  USPC .......... 257/773, 776, 777, E23.141, E23.143, 257/E23.168, E23.169, E23.17, 693, 698, 257/723, 778, 787
  See application file for complete search history.

(56) References Cited

U.S. PATENT DOCUMENTS

| | | | |
|---|---|---|---|
| 6,429,045 B1 * | 8/2002 | Furukawa et al. | 438/107 |
| 7,402,901 B2 * | 7/2008 | Hatano et al. | 257/684 |
| 2006/0001152 A1 * | 1/2006 | Hu | 257/707 |

* cited by examiner

*Primary Examiner* — Jasmine Clark
(74) *Attorney, Agent, or Firm* — Schwabe, Williamson & Wyatt, P.C.

(57) ABSTRACT

Embodiments of the present disclosure are directed towards interconnect structures for embedded bridge in integrated circuit (IC) package assemblies. In one embodiment, a method includes depositing an electrically insulative layer on a bridge interconnect structure, the bridge interconnect structure including a die contact that is configured to route electrical signals between a first die and a second die, depositing a sacrificial layer on the electrically insulative layer, forming an opening through the sacrificial layer and the electrically insulative layer to expose the die contact and forming a die interconnect of the first die or the second die by depositing an electrically conductive material into the opening. Other embodiments may be described and/or claimed.

11 Claims, 8 Drawing Sheets

INTERCONNECT STRUCTURES FOR EMBEDDED BRIDGE

FIELD

Embodiments of the present disclosure generally relate to the field of integrated circuits, and more particularly, to interconnect structures for embedded bridge, in integrated circuit (IC) package assemblies.

BACKGROUND

Emerging package assemblies may include embedded bridge interconnection to provide faster communication between dies such as, for example, processors and memory chips. Current technologies used to fabricate first level interconnection (FLI) between dies and the bridge to enable higher performance computing may be reaching size constraint limitations. For example, as dies continue to shrink to smaller dimensions, a finer pitch is generally needed between interconnect structures at the FLI level. The finer pitch of emerging dies may be pushing alignment capabilities of current lithography processes used to fabricate the FLI structures. Decreasing the pitch between FLI structures may further result in defects such as bridging.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe interconnect structures for embedded bridge in integrated circuit (IC) package assemblies. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

Figure 1:
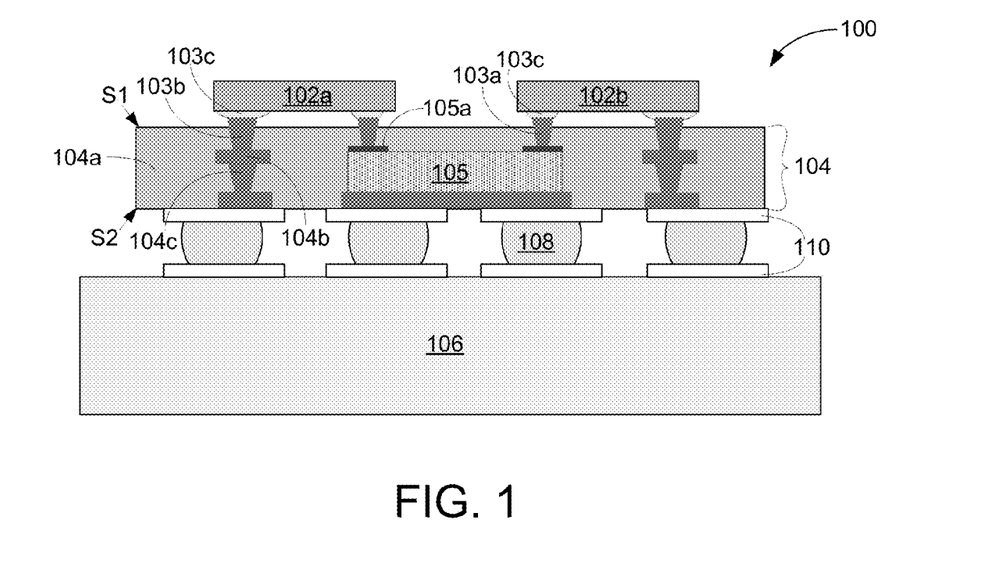
FIG. 1 schematically illustrates a cross-section side view of an example integrated circuit (IC) package assembly, in accordance with some embodiments.

FIG. 1 schematically illustrates a cross-section side view of an example integrated circuit (IC) package assembly (hereinafter "package assembly 100"), in accordance with some embodiments. According to various embodiments, the package assembly 100 may include dies 102a, 102b coupled with a package substrate 104 using first-level interconnect (FLI) structures (e.g., pillars 103a, 103b and solderable material 103c). The package substrate 104 may be coupled with a circuit board 106 using second-level interconnect (SLI) structures (e.g., solder balls 108). The FLI structures and/or the SLI structures may include other suitable structures including additional or alternative structures than depicted in other embodiments. Hereinafter, the FLI structures may be referred to as "die interconnects" and the SLI structures may be referred to as "package interconnects."

A bridge interconnect structure (hereinafter "bridge 105") may be embedded in the package substrate 104 and configured to route electrical signals between the dies 102a, 102b through die interconnects that are coupled with die contacts 105a of the bridge 105. The die interconnects may include, for example, pillars 103a and/or solderable material 103c that form high density interconnects such as, for example, bumps or pillars that provide a pathway for communication between the dies 102a, 102b through the bridge. The die interconnects including the pillars 103a may be referred to as "bridge-to-die interconnects."

In some embodiments, the pillars 103a extend through electrically insulative material 104a of the package substrate 104. In some embodiments, the electrically insulative material 104a may include material (e.g., epoxy based material) of one or more build-up layers that at least partially encapsulate the bridge 105. In some embodiments, the electrically insulative material 104a disposed between the bridge 105 and the first side S1 of the package substrate 104 is an electrically insulative layer (e.g., build-up layer) of the package substrate 104. In some embodiments, the package substrate 104 is an epoxy-based laminate substrate having a core and/or build-up layers such as, for example, an Ajinomoto Build-up Film (ABF) substrate. The electrically insulative material 104a may include other suitable materials in other embodiments. The pillars 103a may be composed any suitable electrically conductive material including, for example, a metal such as copper.

The bridge 105 may include high density electrical routing features such as, for example, traces (not shown) or other suitable features disposed between die contacts 105a that provide an electrical pathway for electrical signals between the dies 102a, 102b through the bridge 105. The bridge 105 may provide routing for electrical signals such as, for example, input/output (I/O) signals and/or power/ground associated with operation of the dies 102a, 102b. In some embodiments, one of the dies 102a, 102b may be a processor such as a central processing unit (CPU) and the other of the dies 102a, 102b may be memory. In other embodiments, the die 102a or 102b may include, or be a part of a processor, memory, system-on-chip (SoC), ASIC or may be configured to perform another suitable function. The bridge 105 may be composed of a variety of suitable materials including, for example, semiconductor materials or glass. In one embodiment, the bridge 105 may be composed of silicon and may be in the form of a die.

In some embodiments, individual contacts of the die contacts 105a may be coupled with corresponding die interconnects (e.g., pillars 103a) of the die 102a and other individual contacts of the die contacts 105a may be coupled with corresponding die interconnects (e.g., pillars 103a) of the die 102b. The die contacts 105a may include, for example, individual pads that correspond with individual die interconnects. For example, the die interconnects may include individual pillars of the pillars 103a that are in contact with corresponding individual pads of the die contacts 105a. The die contacts 105a may serve as lands to receive the pillars 103a and may be configured to route the electrical signals between the dies 102a, 102b.

In some embodiments, the die interconnects may include pillars 103b configured to route electrical signals between one or both of the dies 102a, 102b and an external device external to the package substrate 104 such as, for example, a circuit board 106. For example, the pillars 103b may be electrically coupled with other electrical routing features such as, for example, conductive layer 104b, vias 104c, trenches or traces and the like that are configured to route electrical signals of the dies 102a, 102b between the first side S1 and the second side S2 of the package substrate 104. The pillars 103b and other electrically conductive structures (e.g., conductive layer 104b, vias 104c) may be composed of any suitable electrically conductive material including, for example, a metal such as copper.

The pillars 103a and/or 103b of the die interconnects may extend through the electrically insulative material 104a and protrude beyond a surface (e.g., the first side S1) of the electrically insulative material and have a tapered profile consistent with being formed by a laser drilling technique, as can be seen. Further, in some embodiments, no pad structure intervenes between the pillars 103a and/or 103b and the dies 102a, 102b, which may provide a die interconnect referred to as a "pad-less pillar." In an embodiment where solderable material 103c is disposed on the pillars 103a and/or 103b, no pad structure intervenes between the pillars 103a and/or 103b and the solderable material 103c. Benefits of such configuration of the pillars 103a, 103b are further described in connection with FIG. 2.

Although solderable material 103c is disposed on the pillars 103a and 103b in the depicted embodiment of FIG. 1, in other embodiments, no solderable material may be disposed between the pillars 103a and/or 103b and the dies 102a, 102b. For example, a thermocompression bonding technique or other suitable non-solder process may be used to couple contacts (e.g., pads, not shown) disposed on the dies with the pillars 103a and/or 103b.

The depicted die interconnects (e.g., pillars 103a, 103b and solderable material 103c) in FIG. 1 are merely examples the sake of discussion. The package substrate 104 may include more or fewer interconnect structures than depicted. In some embodiments, an electrically insulative material such as, for example, molding compound or underfill material (not shown) may at least partially encapsulate a portion of dies 102a and/or 102b, and/or a protruding portion of the pillars 103a, 103b and/or solderable material 103c.

The circuit board 106 may be a printed circuit board (PCB) composed of an electrically insulative material such as an epoxy laminate. For example, circuit board 106 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures such as traces, trenches, vias and the like may be formed through the electrically insulating layers to route the electrical signals of the dies 102a, 102b through the circuit board 106. The circuit board 106 may be composed of other suitable materials in other embodiments. In some embodiments, the circuit board 106 is a motherboard (e.g., motherboard 502 of FIG. 5).

Package interconnects such as, for example, solder balls 108, which may be arranged in a ball-grid array (BGA) configuration, may be coupled to one or more pads 110 on the second side S2 of the package substrate 104 and one or more pads 110 on the circuit board 106, as can be seen, to form corresponding solder joints that are configured to further route the electrical signals of the dies 102a, 102b between the package substrate 104 and the circuit board 106. The pads may be composed of any suitable material such as metal including, for example, nickel (Ni), palladium (Pd), gold (Au), silver (Ag), copper (Cu), or combinations thereof. Other suitable techniques to physically and/or electrically couple package substrate 104 with circuit board 106 may be used in other embodiments. For example, in some embodiments, package interconnects may include land-grid array (LGA) structures or other suitable structures.

Figure 2:
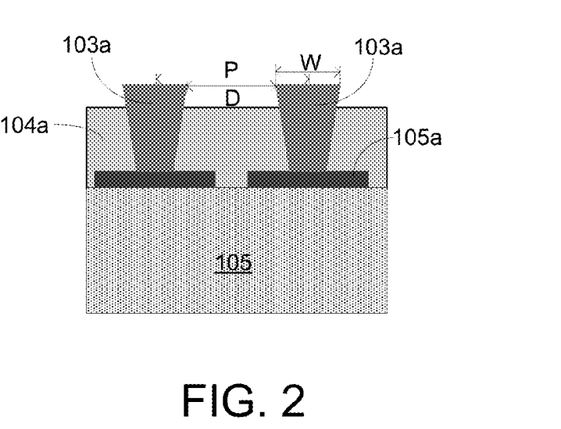
FIG. 2 schematically illustrates a cross-section side view of adjacent bridge-to-die interconnect structures, in accordance with some embodiments.

FIG. 2 schematically illustrates a cross-section side view of adjacent bridge-to-die interconnect structures (e.g., pillars 103a), in accordance with some embodiments. In some embodiments, the pillars 103a depicted in FIG. 2 may represent adjacent pillars that are configured to route electrical signals between one of the dies 102a, 102b and the bridge 105 of FIG. 1.

As can be seen in the depicted embodiment, each of the pillars 103a is disposed on and electrically coupled with corresponding die contacts 105a of the bridge 105. Each of the pillars 103a may extend through electrically insulative material 104a of a package substrate and protrude beyond a surface of the electrically insulative material 104a. The protruding portions of the pillars 103a may be configured to couple directly with a die (e.g., die 102a or 102b) using solderable material (e.g., solderable material 103c of FIG. 1) or other suitable fusing technique. In some embodiments, each of the pillars 103a may have a tapered profile consistent with being formed by a laser drilling technique, as can be seen.

Further, in some embodiments, no pad structure may be disposed on the pillars 103a to provide a "pad-less pillar." Such pad-less pillar configuration may increase alignment tolerance of die interconnects that include the pillars 103a relative to die interconnects that include pillars with pads disposed on the pillars. For example, die interconnects including pad-less pillars (e.g., pillars 103a) may be separated by a minimum distance, D, of about 31 microns for a pitch, P, of about 55 microns and a width, W, of about 24 microns. However, die interconnects including pillars with pads disposed thereon (not shown) may be separated by a minimum distance D of about 12 microns for a similar pitch of about 55 microns and a width W of about 43 microns. The shorter minimum distance of 12 microns may result in defects or tighter alignment capability for pillars with pads disposed thereon, which may result in increased cost of manufacturing. The pad-less pillar may also eliminate formation/alignment of the via on the pillar altogether, which may reduce cost and/or complexity of fabrication of a package substrate. In some embodiments, a pitch between die interconnects including pillars 103a may be 55 microns or less.

Figure 3A:
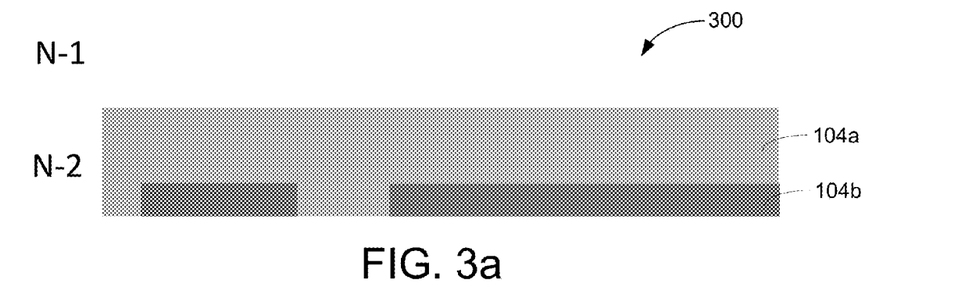
FIGS. 3a-o schematically illustrate cross-section side views of a package substrate during various stages of fabrication, in accordance with some embodiments.
Figure 3B:
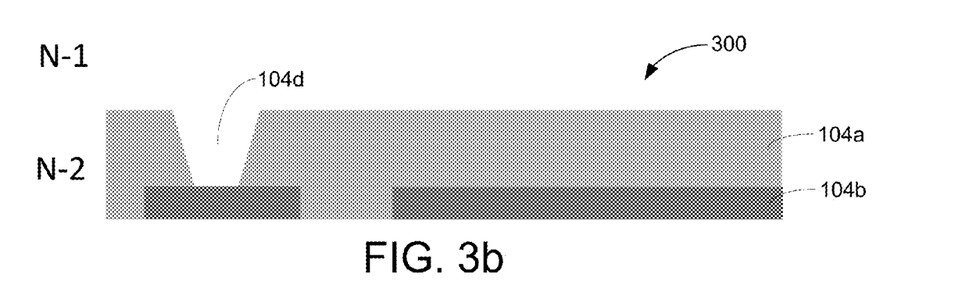
Figure 3C:
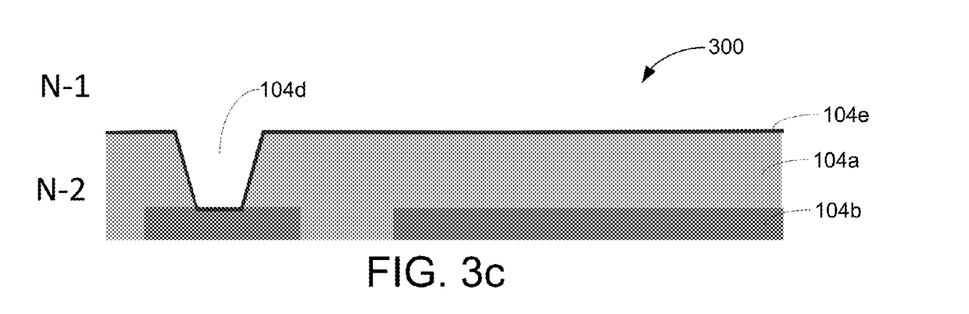
Figure 3D:
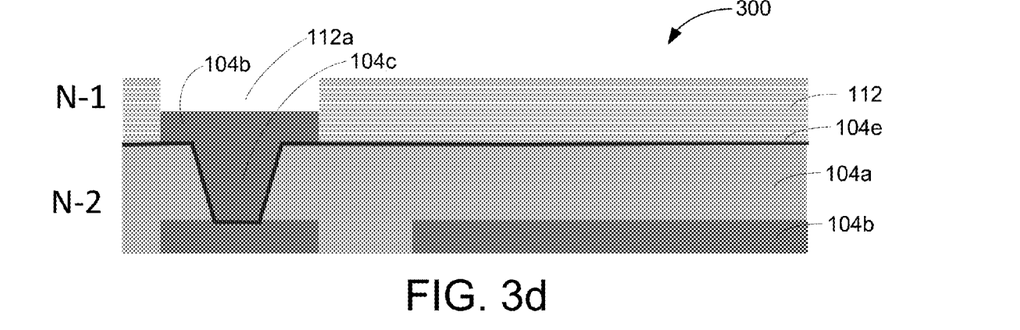
Figure 3E:
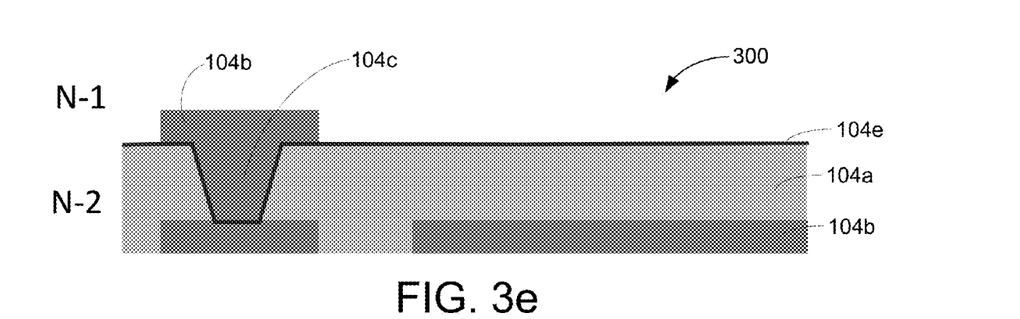
Figure 3F:
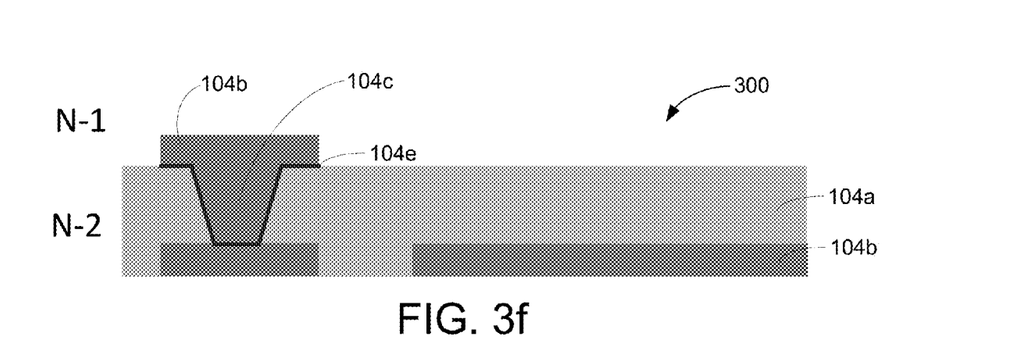
Figure 3G:
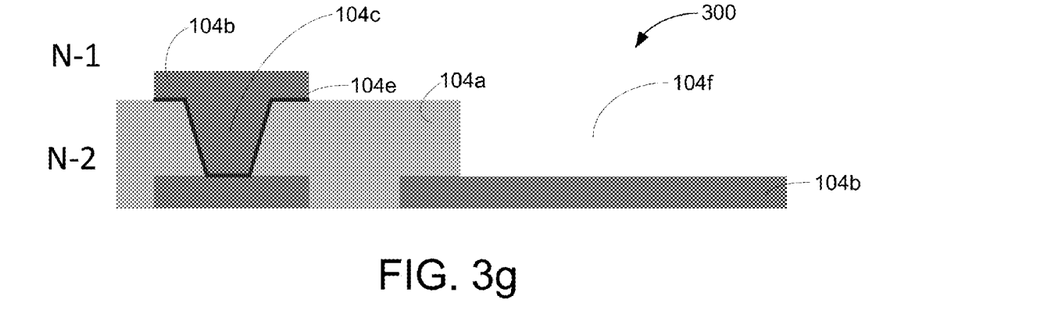
Figure 3H:
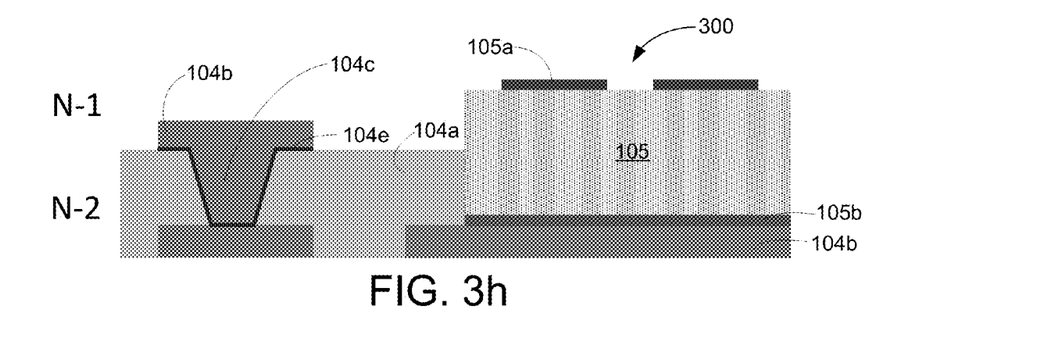
Figure 3I:
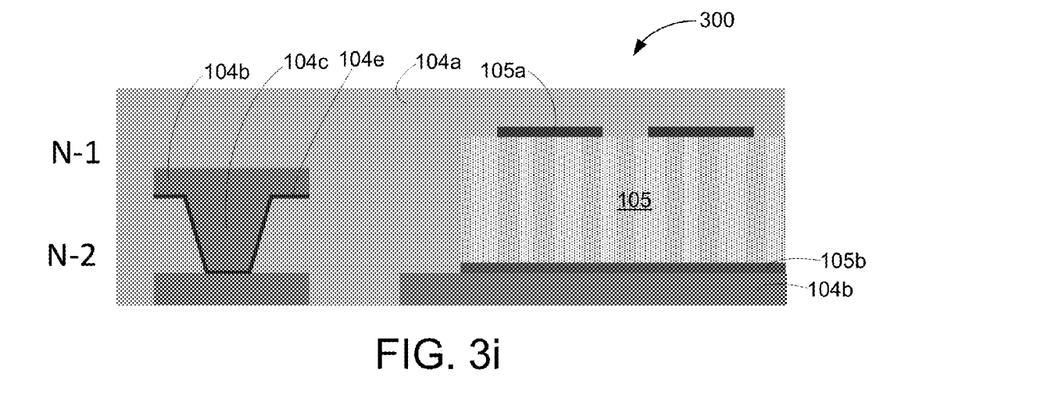
Figure 3J:
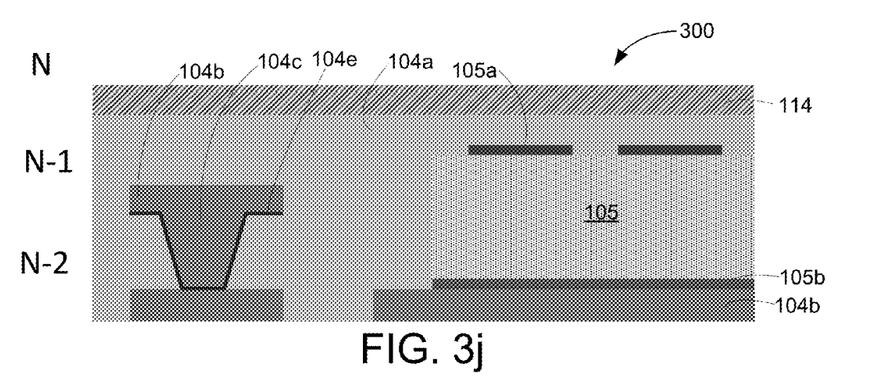
Figure 3K:
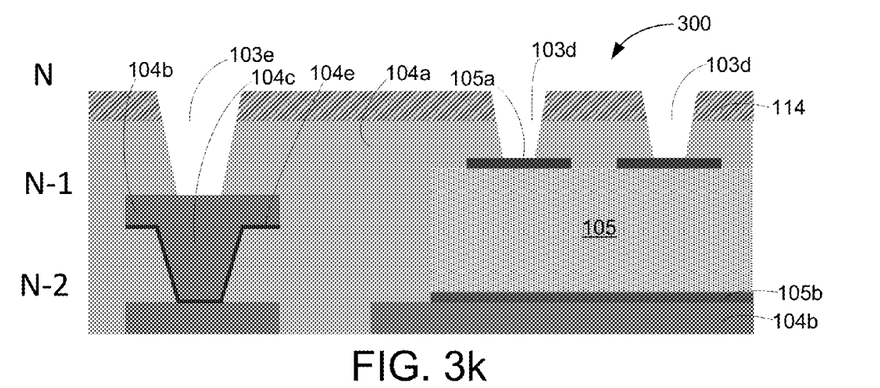
Figure 3L:
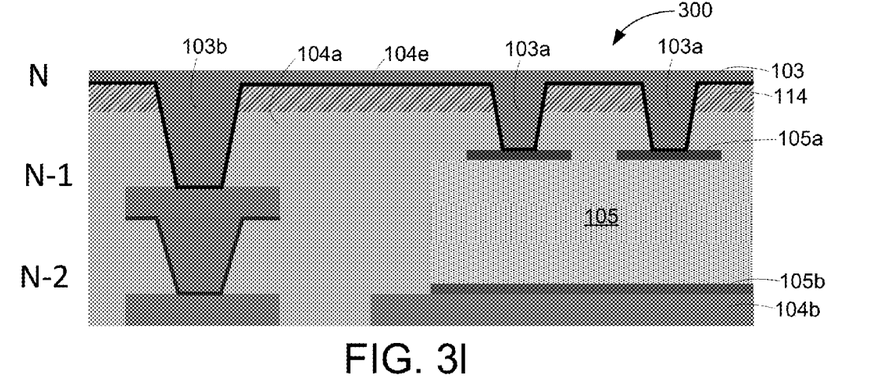
Figure 3M:
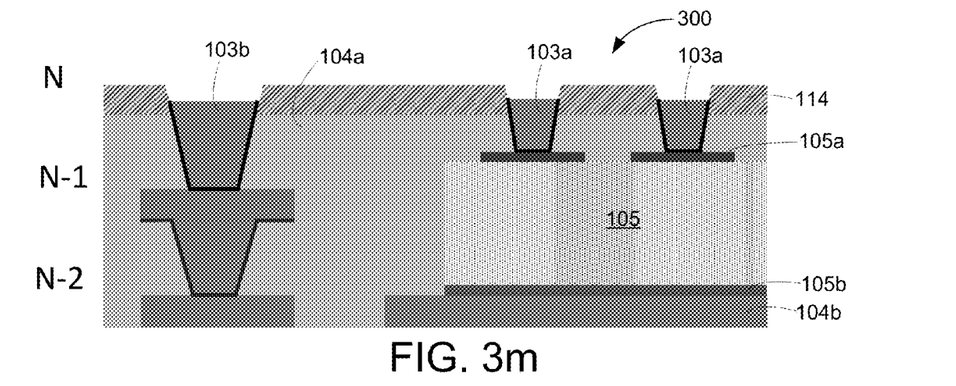
Figure 3N:
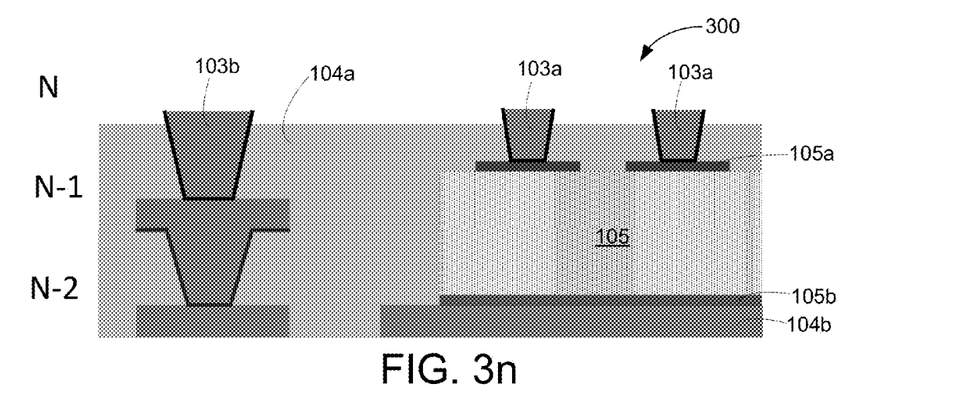
Figure 3O:
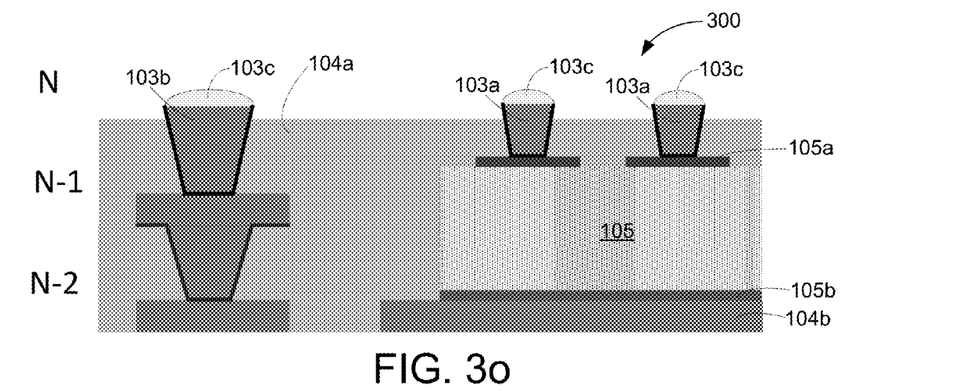

FIGS. 3a-o schematically illustrate cross-section side views of package substrate 300 during various stages of fabrication, in accordance with some embodiments. According to various embodiments, the package substrate 300 may comport with embodiments described in connection with package substrate 104 of FIG. 1 and vice versa.

In FIG. 3a, the package substrate 300 is depicted subsequent to depositing electrically insulative material (hereinafter "dielectric 104a") of a build-up layer (e.g., N-2 layer) on a patterned metal layer (e.g., conductive layer 104b), as can be seen. In embodiments, the patterned metal layer and any number of layers below the patterned metal layer may be part of the package substrate, and may be formed in any manner known in the art. For example, the patterned metal layer may be a top or outermost conductive layer of a build-up layer formed with a semi-additive process (SAP).

In embodiments, the dielectric 104a may be composed of any of a wide variety of suitable dielectric materials including, for example, epoxy-based material, which may be deposited using a lamination process such as ABF lamination. In embodiments, the dielectric 104a may include a polymer with silica filler to provide suitable mechanical properties that meet reliability requirements of the package. In embodiments, the dielectric 104a may have a suitable ablation rate to enable laser drilling through the dielectric 104a.

In FIG. 3b, the package substrate 300 is depicted subsequent to forming an opening 104d in the dielectric 104a. In embodiments, the opening 104d may be a via hole which may be laser drilled into the dielectric 104a to expose a portion of the conductive layer 104b. Any suitable laser drilling technique may be used to form the opening 104d including, for example, using a $CO_2$ laser. In embodiments, subsequent to laser drilling, a desmear process may be used to remove remaining dielectric material, such as epoxy-resin, from the surface of the conductive layer 104b.

In FIG. 3c, the package substrate 300 is depicted subsequent to depositing a metallic seed layer 104e on exposed surfaces of the package substrate 300, as can be seen. The metallic seed layer 104e may be deposited on surfaces within the opening 104d and on the dielectric 104a using any suitable technique. In some embodiments, electroless plating may be used to form the metallic seed layer 104e. For example, a catalyst, such as palladium (Pd) may be deposited followed by an electroless copper (Cu) plating process. In some embodiments, a physical vapor deposition (i.e., sputtering) technique may be used to deposit the metallic seed layer 104e.

In FIG. 3d, the package substrate 300 is depicted subsequent to depositing and patterning a photosensitive layer 112 to provide an opening 112a in the photosensitive layer over the opening 104d of FIG. 3c and depositing a conductive material such as a metal to form a via 104c and conductive layer 104b on the via 104c, as can be seen. The photosensitive layer 112 may include, for example, a dry film resist (DFR) deposited using any suitable technique. In embodiments, the opening 112a may have a lateral dimension that is greater than a lateral dimension of the opening 104d, as can be seen. The conductive material of the via 104c and/or conductive layer 104b may include a metal such as, for example, copper (Cu), nickel (Ni), palladium (Pd), gold (Au), silver (Ag), or combinations thereof. In embodiments, the openings 104d and 112a may be filled with an electrolytic plating process. In embodiments, the conductive layer 104b may be disposed above the surface of the N-2 layer, as can be seen.

In FIG. 3e, the package substrate 300 is depicted subsequent to removing the photosensitive layer 112, as can be seen. The photosensitive layer 112 may be removed using any suitable stripping process.

In FIG. 3f, the package substrate 300 is depicted subsequent to etching portions of the metallic seed layer 104e, as can be seen. In embodiments, an etching process may remove exposed portions of metallic seed layer 104e to expose the underlying dielectric 104a. A portion of the metallic seed layer 104e may remain between the via 104c, the conductive layer 104b and the dielectric 104a, as can be seen.

In FIG. 3g, the package substrate 300 is depicted subsequent to forming a bridge cavity 104f for placement of a bridge (e.g., bridge 105 of FIG. 3h), as can be seen. In embodiments, the bridge cavity 104f may be formed by thermal, mechanical, laser ablation or etching processes may be provided for placement of a bridge. In some embodiments, the dielectric 104a may be removed in the region of the bridge cavity 104f to expose the conductive layer 104b, as can be seen. In other embodiments, the bridge cavity 104f may be left open during fabrication of the build-up layers (e.g., the N-2 layer). In some embodiments, the bridge cavity 104f may be formed through the dielectric 104a using a patterning process. For example, dielectric 104a may be composed of a photosensitive material that is amenable to masking, patterning and etching, and/or develop processes.

In FIG. 3h, the package substrate 300 is depicted subsequent to mounting bridge 105 (only a part of the bridge may be depicted), as can be seen. In embodiments, the bridge 105 may include a bridge substrate composed of glass or a semiconductor material, such as high resistivity silicon (Si) having electrical routing interconnect features formed thereon, to provide a chip-to-chip connection between dies. The bridge 105 may be mounted on the conductive layer 104b using an adhesive 105b in some embodiments. The material of the adhesive 105b may include any suitable adhesive configured to withstand processes associated with fabrication of the package substrate 300. In embodiments, chemical treatments, such as, for example, a copper roughing technique may be applied to improve adhesion between the bridge 105 and the conductive layer 104b. In embodiments, the bridge 105 may include die contacts 105a, such as pads, protruding above the surface of the bridge substrate, and configured to serve as connection points for routing of electrical signals to and from the bridge 105.

In FIG. 3i, the package substrate 300 is depicted subsequent to forming another build-up layer (e.g., N-1 layer) composed of dielectric 104a on the bridge 105 and the underlying build-up layer (e.g., N-2 layer), as can be seen. The dielectric 104a of the N-1 layer may be deposited using techniques described in connection with depositing dielectric 104a of the N-2 layer according to various embodiments.

In FIG. 3j, the package substrate 300 is depicted subsequent to depositing a sacrificial layer 114 on the dielectric 104a, as can be seen. The sacrificial layer 114 may include any of a variety of suitable electrically insulative materials such as, for example, materials described in connection with dielectric 104a. In some embodiments, the sacrificial layer 114 may be include a polymer film (e.g., epoxy-based material) deposited using a lamination processes. The sacrificial layer 114 may have a suitable ablation rate to enable laser drilling through the sacrificial layer 114. In some embodiments, the sacrificial layer 114 may be peelable, such that the sacrificial layer 114 can be removed using a peel-off process.

In FIG. 3k, the package substrate 300 is depicted subsequent to forming openings 103d through the sacrificial layer 114 and dielectric 104a over the bridge 105 to expose the die contacts 105a and forming openings 103e through the sacrificial layer 114 and dielectric 104a over the bridge 105 to expose the conductive layer 104b over the via 104c, as can be seen. In embodiments, the openings 103d and 103e may be formed using a laser drilling process. The openings 103d and 103e may have a tapered profile, in some embodiments, consistent with being formed by laser drilling. The openings 103d and 103e may be formed using other suitable techniques including, for example, suitable patterning processes and the like in other embodiments. In embodiments, a desmear process may be used to remove dielectric 104a, such as epoxy-resin, from the bottom of the openings 103d and 103e.

In FIG. 3l, the package substrate 300 is depicted subsequent to depositing electrically conductive material on exposed surfaces of the package substrate of FIG. 3k. The deposited electrically conductive material may form interconnects of an outermost layer (e.g., N layer) of the package substrate 300.

For example, a metallic seed layer 104e may be deposited on exposed surfaces in the openings 103d, 103e and on the sacrificial layer 114 using any suitable technique. In some embodiments, the metallic seed layer 104e may be deposited using electroless deposition techniques. For example, a catalyst, such as palladium (Pd) may be deposited followed by an electroless copper (Cu) plating process. In some embodiments, a physical vapor deposition (i.e., sputtering) technique may be used to deposit the metallic seed layer 104e.

An electrically conductive material may be deposited to fill the openings 103d and 103e to form respective pillars 103a and 103b. In some embodiments, depositing the electrically conductive material further forms an electrically conductive layer 103 on a surface of the sacrificial layer 114, as can be seen. The deposited electrically conductive material may include, for example, a metal such as copper. In some embodiments, the electrically conductive material may be deposited using an electrolytic plating process. Other suitable techniques to deposit the electrically conductive material to form pillars 103a, 103b in the openings 103d, 103e may be used in other embodiments.

In FIG. 3m, the package substrate 300 is depicted subsequent to removing some of the deposited electrically conductive material. In some embodiments, an etch process may be used to remove material from the surface of the sacrificial layer 114 and recess the electrically conductive material of the pillars 103a, 103b below the surface of the sacrificial layer 114, as can be seen. Other suitable techniques may be used instead of or in addition to the etching process to remove portions the deposited electrically conductive material including, for example, buff grinding, chemical-mechanical polishing and the like. In embodiments, the pillars 103a, 103b may protrude above the surface of the N-1 layer.

In FIG. 3n, the package substrate 300 is depicted subsequent to removing the sacrificial layer 114. The sacrificial layer 114 may be removed by a peel-off process that peels the sacrificial layer 114 away from the surface of the N-1 layer. Subsequent, to removal of the sacrificial layers, portions of the of pillars 103a, 103b may protrude from an outer surface of the package substrate 300, as can be seen. The sacrificial layer 114 may be removed using other suitable techniques such as etching and the like in other embodiments.

In FIG. 3o, the package substrate 300 is depicted subsequent to depositing solderable material 103c on the pillars 103a, 103b. In some embodiments, subsequent to removing the electrically conductive material (e.g., electrically conductive layer 103) as described in connection with FIG. 3l, solderable material 103c may be deposited on the pillars 103a, 103b. For example, in some embodiments, prior to removing the sacrificial layer 114, the solderable material may be deposited (e.g., using a past-printing process) followed by a reflow process and/or deflux process. The sacrificial layer 114 may be removed subsequent to depositing the solderable material. Other intervening layers such one or more surface finish layers (not shown) may be formed on the pillars 103a, 103b to facilitate bonding of the solderable material 103c with the pillars 103a, 103b or bonding of the pillars 103a, 103b with dies according to various embodiments. In some embodiments, no solderable material may be deposited on the pillars 103a, 103b.

Figure 4:
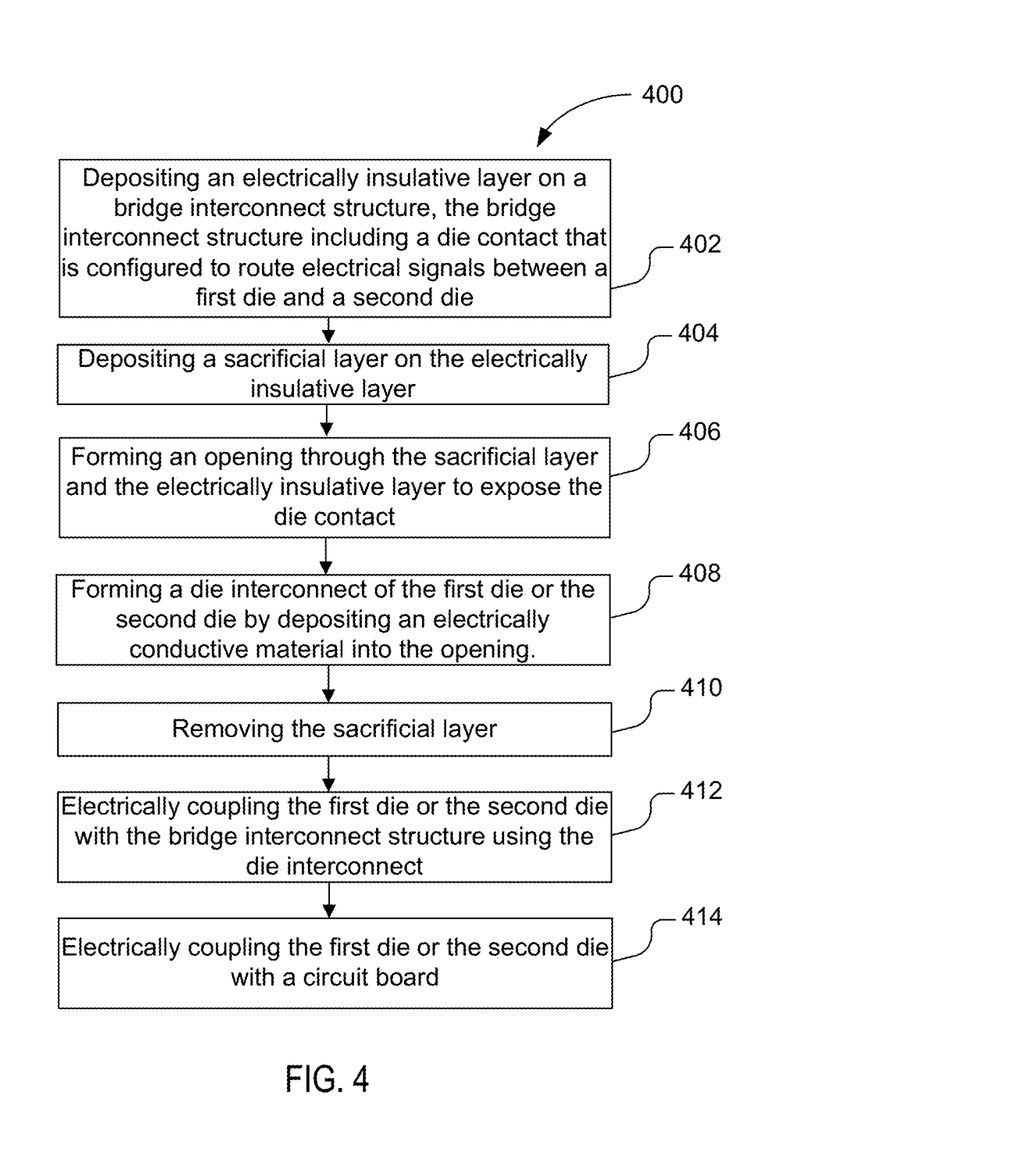
FIG. 4 schematically illustrates a flow diagram of a method of fabricating an IC package assembly, in accordance with some embodiments.

FIG. 4 schematically illustrates a flow diagram of a method 400 of fabricating an IC package assembly (e.g., package assembly 100 of FIG. 1 or package substrate 300 of FIG. 3n or FIG. 3o), in accordance with some embodiments. The method 400 may comport with techniques described in connection with FIGS. 1, 2 and 3a-o.

At 402, the method 400 may include depositing an electrically insulative layer (e.g., N-1 layer of FIG. 3i) on a bridge interconnect structure (e.g., bridge 105 of FIG. 3i), the bridge interconnect structure including a die contact (e.g., die contact 105a of FIG. 3i) that is configured to route electrical signals between a first die (e.g., die 102a of FIG. 1) and a second die (e.g., die 102b of FIG. 1). In some embodiments, depositing the electrically insulative layer includes depositing a build-up layer (e.g., using a lamination process).

At 404, the method 400 may include depositing a sacrificial layer (e.g., sacrificial layer 114 of FIG. 3j) on the electrically insulative layer. In some embodiments, depositing the sacrificial layer may be performed using a lamination process.

At 406, the method 400 may include forming an opening through the sacrificial layer and the electrically insulative layer to expose the die contact. In some embodiments, the opening may be formed by a laser drilling process.

At 408, the method 400 may include forming a die interconnect of the first die or the second die by depositing an electrically conductive material into the opening. In some embodiments, the die interconnect may be formed by depositing a metal using an electrolytic plating process to fill the opening and form a pillar (e.g., pillar 103a, 103b of FIG. 3l). In some embodiments, depositing the metal may further form a metal layer (e.g., electrically conductive layer 103) on a surface of the sacrificial layer. Portions of the metal such as the metal layer and portions of the metal in the opening may be removed by any suitable process including an etch process. The etch process may recess the metal deposited into the opening. Forming the die interconnect may provide a first-level interconnect (FLI) that protrudes beyond a surface of the electrically insulative layer. In some embodiments, forming the die interconnect includes depositing a solderable material (e.g., solderable material 103c) on the pillar structure.

At 410, the method 400 may include removing the sacrificial layer. In some embodiments, removing the sacrificial layer may be performed by peeling off the sacrificial layer. In some embodiments, removing the sacrificial layer may be performed subsequent to depositing the electrically conductive material (e.g., at 408).

At 412, the method 400 may include electrically coupling the first die or the second die with the bridge interconnect structure using the die interconnect. The first die or the second die may be coupled using any suitable technique to bond the pillar with a corresponding contact on the first die or the second die including, for example, solder reflow to couple solderable material on the pillar with the contact or a thermocompression technique to fuse the pillar with the contact and the like.

At 414, the method 400 may include electrically coupling the first die or the second die with a circuit board (e.g., circuit board 106 of FIG. 1). Actions at 414 may include coupling a package substrate (e.g., package substrate 104) including the bridge interconnect structure with the circuit board using any suitable technique. For example, in some embodiments, the package substrate may be coupled with the circuit board using suitable BGA or LGA techniques.

Various operations are described as multiple discrete operations in turn, in a manner that is most helpful in understanding the claimed subject matter. However, the order of description should not be construed as to imply that these operations are necessarily order dependent. For example, actions of the method 400 be performed in another suitable order than depicted.

Figure 5:
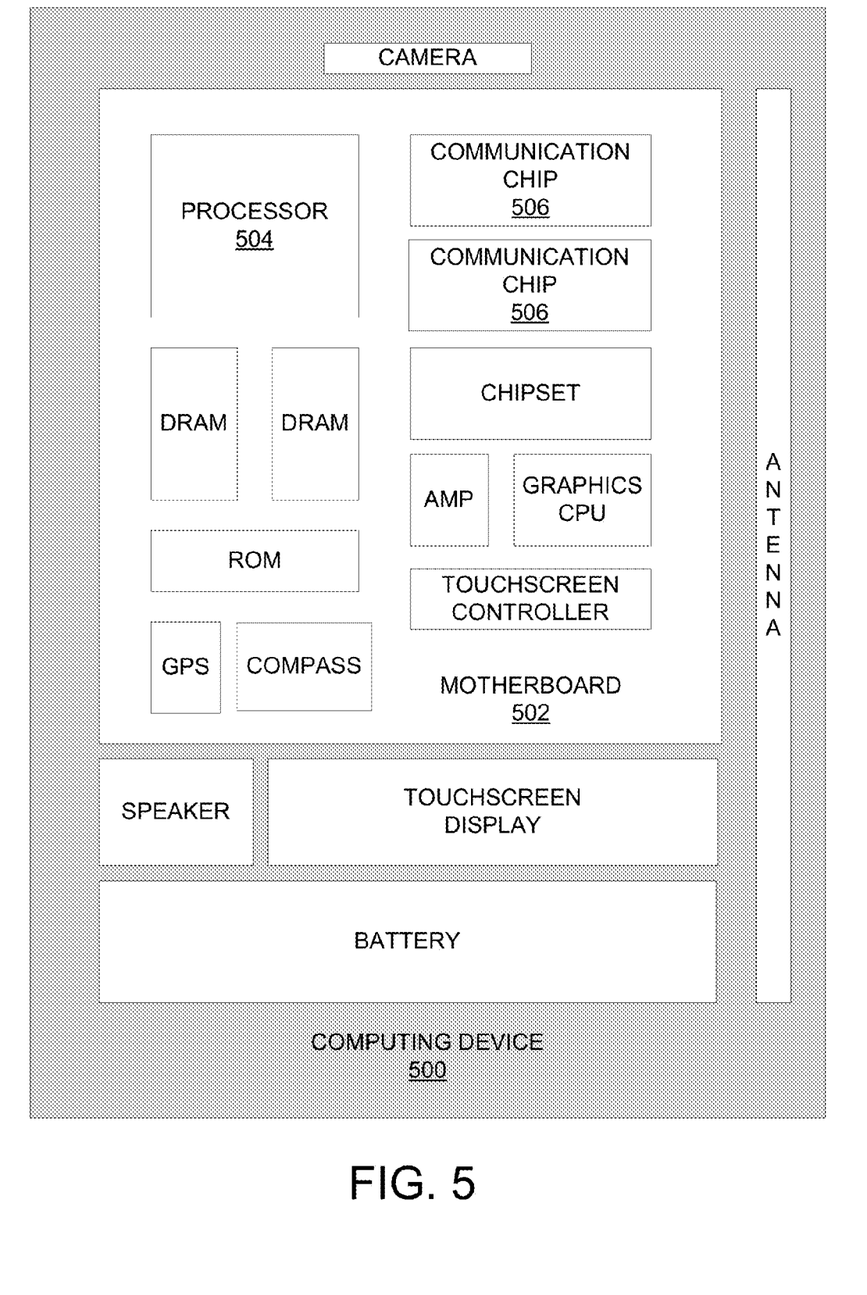
FIG. 5 schematically illustrates a computing device that includes an IC package assembly or package substrate as described herein, in accordance with some embodiments.

Embodiments of the present disclosure may be implemented into a system using any suitable hardware and/or software to configure as desired. FIG. 5 schematically illustrates a computing device 500 that includes an IC package assembly (e.g., package assembly 100 of FIG. 1) or package substrate (e.g., package substrate 300 of FIGS. 3n-o) as described herein, in accordance with some embodiments. The computing device 500 may include housing to house a board such as motherboard 502. Motherboard 502 may include a number of components, including but not limited to processor 504 and at least one communication chip 506. Processor 504 may be physically and electrically coupled to motherboard 502. In some implementations, the at least one communication chip 506 may also be physically and electrically coupled to motherboard 502. In further implementations, communication chip 506 may be part of processor 504.

Depending on its applications, computing device 500 may include other components that may or may not be physically and electrically coupled to motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

Communication chip 506 may enable wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. Communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 506 may operate in accordance with other wireless protocols in other embodiments.

Computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

Processor 504 of computing device 500 may be packaged in an IC assembly (e.g., package assembly 100 of FIG. 1) or package substrate (e.g., package substrate 300 of FIGS. 3*n-o*) as described herein. For example, circuit board 106 of FIG. 1 may correspond with motherboard 502, and processor 504 may correspond with one of dies 102*a*, 102*b* coupled to the package substrate 104 or 300 using pillars 103*a* or 103*b*. The package substrate 104 or 300 and motherboard 502 may be coupled together using package level interconnects. The term "processor" may refer to any device or portion of a device that processes electronic data from registers and/or memory to transform that electronic data into other electronic data that may be stored in registers and/or memory.

Communication chip 506 may also include a die (e.g., die 102*a* or 102*b* of FIG. 1) that may be packaged in an IC assembly (e.g., package assembly 100 of FIG. 1) or package substrate (e.g., package substrate 300 of FIGS. 3*n-o*) as described herein. In further implementations, another component (e.g., memory device or other integrated circuit device) housed within computing device 500 may include a die (e.g., die 102*a* or 102*b* of FIG. 1) that may be packaged in an IC assembly (e.g., package assembly 100 of FIG. 1) or package substrate (e.g., package substrate 300 of FIGS. 3*n-o*) as described herein. According to some embodiments, multiple processor chips and/or memory chips may be disposed on a same package substrate and the embedded bridges with layered interconnect structures may electrically route signals between any two of the processor or memory chips. In some embodiments, a single processor chip may be coupled with another processor chip using a first embedded bridge and a memory chip using a second embedded bridge.

In various implementations, computing device 500 may be a laptop, a netbook, a notebook, an Ultrabook™, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

EXAMPLES

According to various embodiments, the present disclosure describes a method of fabricating a package assembly, the method comprising depositing an electrically insulative layer on a bridge interconnect structure, the bridge interconnect structure including a die contact that is configured to route electrical signals between a first die and a second die, depositing a sacrificial layer on the electrically insulative layer, forming an opening through the sacrificial layer and the electrically insulative layer to expose the die contact and forming a die interconnect of the first die or the second die by depositing an electrically conductive material into the opening. In some embodiments, depositing the electrically insulative layer includes depositing a build-up layer using a lamination process. In some embodiments, the method further includes removing the sacrificial layer subsequent to depositing the electrically conductive material. In some embodiments, depositing the sacrificial layer is performed by lamination and removing the sacrificial layer is performed by peeling off the sacrificial layer. In some embodiments, forming the opening is performed by a laser drilling process.

In some embodiments, depositing the electrically conductive material includes depositing a metal using an electrolytic plating process to fill the opening and depositing the metal forms a metal layer on a surface of the sacrificial layer. In some embodiments, the method further includes etching the metal to remove the metal layer from the surface of the sacrificial layer, wherein the etching recesses the metal deposited in the opening. In some embodiments, forming the die interconnect provides a first-level interconnect including a pillar structure that protrudes beyond a surface of the electrically insulative layer. In some embodiments, forming the die interconnect further comprises depositing a solderable material on the pillar structure. In some embodiments, the method further includes electrically coupling the first die or the second die with the bridge interconnect structure using the die interconnect.

According to various embodiments, the present disclosure describes an apparatus (e.g., a package assembly) comprising a bridge interconnect structure including a die contact that is configured to route electrical signals between a first die and a second die, an electrically insulative layer disposed on the bridge interconnect structure, and a die interconnect of the first die or the second die disposed on and electrically coupled with the die contact, the die interconnect including a pillar structure that extends through the electrically insulative layer and protrudes beyond ial from the surface of the sacrificial layer 114 and recess the electrically conductive material of the pillars 103*a*, 103*b* below the surface of the sacrificial layer 114, as solderable material disposed on the pillar structure. In some embodiments, no pad structure intervenes between the pillar structure and the solderable material.

In some embodiments, the bridge interconnect structure comprises a semiconductor material. In some embodiments, the electrically insulative layer comprises a build-up layer of a package substrate. In some embodiments, the package assembly further includes electrical routing features disposed in the electrically insulative layer and configured to route electrical signals between the first die or the second die and a circuit board. In some embodiments, the die interconnect is a first die interconnect of the first die and the package assembly further includes a second die interconnect of the first die, wherein a pitch between the first die interconnect and the second die interconnect is 55 microns or less.

According to various embodiments, the present disclosure describes a system (e.g., a computing device) comprising a package assembly including a bridge interconnect structure including a first die contact and a second die contact that are configured to route electrical signals between a first die and a second die, an electrically insulative layer disposed on the bridge interconnect structure, a first die interconnect disposed on and electrically coupled with the first die contact, a second die interconnect disposed on and electrically coupled with the second die contact, the first die coupled with the first die interconnect, and the second die coupled with the second die interconnect, wherein the first die interconnect and the second die interconnect each include a pillar structure that extends through the electrically insulative layer and protrudes beyond a surface of the electrically insulative layer; and a circuit board coupled with the circuit board using package interconnects.

In some embodiments, the computing device further includes electrical routing features disposed in the electrically insulative layer and configured to route electrical signals between each of the first die and the second die and the circuit board. In some embodiments, the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A package assembly comprising:
   a bridge interconnect structure including a die contact and electrical routing features to route electrical signals between a first die and a second die;
   an electrically insulative layer disposed on the bridge interconnect structure; and
   a die interconnect of the first die or the second die disposed on and electrically coupled with the die contact, the die interconnect including a pillar structure that extends through the electrically insulative layer and protrudes beyond a surface of the electrically insulative layer.

2. The package assembly of claim 1, wherein the pillar structure has a tapered profile.

3. The package assembly of claim 1, wherein the die interconnect further includes a solderable material disposed on the pillar structure.

4. The package assembly of claim 3, wherein no pad structure intervenes between the pillar structure and the solderable material.

5. The package assembly of claim 1, wherein the bridge interconnect structure comprises a semiconductor material.

6. The package assembly of claim 1, wherein the electrically insulative layer comprises a build-up layer of a package substrate.

7. The package assembly of claim 1, the package assembly further comprising:
   electrical routing features disposed in the electrically insulative layer and configured to route electrical signals between the first die or the second die and a circuit board.

8. The package assembly of claim 1, wherein the die interconnect is a first die interconnect of the first die, the package assembly further comprising:
   a second die interconnect of the first die, wherein a pitch between the first die interconnect and the second die interconnect is 55 microns or less.

9. A computing device comprising:
   a package assembly including
      a bridge interconnect structure including a first die contact and a second die contact that are configured to route electrical signals between a first die and a second die,
      an electrically insulative layer disposed on the bridge interconnect structure,
      a first die interconnect disposed on and electrically coupled with the first die contact,
      a second die interconnect disposed on and electrically coupled with the second die contact,
      the first die coupled with the first die interconnect, and
      the second die coupled with the second die interconnect, wherein the first die interconnect and the second die interconnect each include a pillar structure that extends through the electrically insulative layer and protrudes beyond a surface of the electrically insulative layer; and
   a circuit board coupled with at least one of the first die or the second die, using package interconnects.

10. The computing device of claim 9, further comprising:
    electrical routing features disposed in the electrically insulative layer and configured to route electrical signals between each of the first die and the second die and the circuit board.

11. The computing device of claim 9, wherein:
    the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *